United States Patent
Yokoyama

(10) Patent No.: US 8,562,367 B2
(45) Date of Patent: Oct. 22, 2013

(54) SOCKET FOR ELECTRICAL PART

(75) Inventor: Yuji Yokoyama, Saitama (JP)

(73) Assignee: Enplas Corporation, Saitama (JP)

( * ) Notice: Subject to any disclaimer, the term of this patent is extended or adjusted under 35 U.S.C. 154(b) by 68 days.

(21) Appl. No.: 13/270,476

(22) Filed: Oct. 11, 2011

(65) Prior Publication Data
US 2012/0100730 A1    Apr. 26, 2012

(30) Foreign Application Priority Data
Oct. 21, 2010 (JP) ................................ 2010-236098

(51) Int. Cl.
*H01R 13/62* (2006.01)

(52) U.S. Cl.
USPC ........................................... 439/331; 439/73

(58) Field of Classification Search
USPC ................................. 439/330, 331
See application file for complete search history.

(56) References Cited

U.S. PATENT DOCUMENTS

| | | | |
|---|---|---|---|
| 5,395,254 A * | 3/1995 | Mogi | 439/70 |
| 6,213,806 B1 * | 4/2001 | Choy | 439/331 |
| 6,776,641 B2 * | 8/2004 | Hachuda | 439/331 |
| 7,097,488 B2 * | 8/2006 | Hayakawa et al. | 439/331 |
| 7,824,188 B2 * | 11/2010 | Yokoyama | 439/73 |

FOREIGN PATENT DOCUMENTS

JP    2003-187937    7/2003

* cited by examiner

*Primary Examiner* — Hien Vu
(74) *Attorney, Agent, or Firm* — Staas & Halsey LLP

(57) ABSTRACT

A socket for electrical part mounted on the wiring substrate to accommodate an electrical part. The present invention comprises a socket body, a floating plate and a holding structure. The socket body has a contact pin unit comprising a unit body in which the plural contact pins are mounted. The floating plate is mounted on upper side of the unit body to accommodate the electrical part, and comprises through holes into which the upper side contact portions of contact pins are inserted. The holding structure holds the floating plate in a descended state when the socket for the electrical part is not yet mounted on the wiring substrate, and releases the holding state of floating plate and makes the floating plate to be capable of moving vertically under the state of being urged upward when the socket for the electrical part is mounted on the wiring substrate.

6 Claims, 18 Drawing Sheets

SOCKET FOR ELECTRICAL PART

BACKGROUND OF THE INVENTION

1. Field of the Invention

The present invention relates to a socket for an electrical part which is mounted on a wiring substrate and accommodates an electrical part such as a semiconductor device (hereinafter called "IC package") for performing a test of the electrical part, for example.

2. Description of the Prior Art

In a known art, there has been provided an IC socket as "a socket for an electrical part" for accommodating and detachably holding an IC package as an "electrical part" (see Japanese patent Gazette No. 3566691).

The IC package comprises a package body (i.e. an electrical part body), the shape of which is a square for example, and the package body is provided with the terminals.

On the other hand, the IC socket comprises a socket body which is mounted on a wiring substrate, and the socket body comprises a contact pin unit provided with plural contact pins for electrically connecting the terminals of the IC package and the wiring substrate.

In addition, a floating plate is mounted in the socket body so as to be capable of moving vertically under the state that the floating plate is urged upward by a spring. The IC socket is constituted so that the IC package is accommodated on the floating plate.

When the IC socket is mounted on the wiring substrate and used, the IC package is accommodated on the floating plate and is pressed from the upper side, consequently, the floating plate moves downward.

Then, the upper side contact portions of the contact pins are pressed onto the terminals of the IC package via the through holes formed in the floating plate, simultaneously, the lower side contact portions of the contact pins are pressed onto the electrode of the wiring substrate.

Under such condition, the electric current is supplied from the wiring substrate to the IC package through the contact pins, then, the burn-in test or other kind of test is performed.

However, in the case such a conventional IC socket is used, the floating plate is positioned at the upper side because of the urging of the spring, when the IC socket is carried under the state that the IC socket is not yet mounted on the wiring substrate. Therefore, the upper side contact portions are possible to come out from the through holes of the floating plate, if the contact pins are too short and the upper side contact portions of them do not deeply enter the through holes.

If the IC socket is mounted on the wiring substrate and used under such state, there is a possibility that any defects, such as collision between lower surface of the floating plate and the upper side contact portion, occur when the floating plate is moved downward.

SUMMARY OF THE INVENTION

The purpose of the present invention is to provide a socket for an electrical part in which the upper side contact portion of the contact pin is not possible to come out from the through hole of the floating plate, even if the contact pin is too short.

To achieve this purpose, the present invention is featured by a socket for an electrical part which is mounted on a wiring substrate and accommodates an electrical part having terminals, wherein; the socket comprises a socket body which is mounted on the wiring substrate and accommodates the electrical part, the socket body comprises a contact pin unit holding plural contact pins to electrically connect the terminals of the electrical part with the wiring substrate, the contact pin unit comprises a unit body in which the plural contact pins are mounted, a floating plate which is disposed on upper side of the unit body to accommodate the electrical part, and comprises through holes into which upper side contact portions of contact pins are inserted, a holding structure which holds the floating plate in a descended state when the socket for the electrical part is not yet mounted on the wiring substrate, and which releases the accommodated floating plate and makes the floating plate to be vertically movable under the state of being urged upward when the socket for the electrical part is mounted on the wiring substrate.

According to the present invention, the floating plate is accommodated in a descended state when the socket is not yet mounted on the wiring substrate, e.g. while carrying the socket, and so the upper side contact portion can be surely inserted into the though hole of the floating plate even if the contact pin is too short. Therefore, different from the conventional art, the upper side contact portion of the contact pin is not possible to come off from the through hole of the floating plate during the socket is conveyed, and so no defect will occur even when the socket is used (e.g. when the floating plate moves vertically).

In addition, the feature of the present invention is that the holding structure further comprises a pin member which is inserted through the unit body and the floating plate vertically so as to be capable of moving vertical and comprises a step portion, a first spring which urges the pin member downward, a second spring which urges the floating plate upward, and an intermediate plate which is inserted into the pin member and located on the step portion to receive the second spring, when the contact pin unit is not yet mounted on the wiring substrate, the holding structure makes the pin member move downward by the urging force of the first spring so that the lower terminal of the pin member projects downward from the unit body, and makes the upper terminal of the pin member, projects upward from the floating plate, to hold the floating plate in a descended state, and when the contact pin unit is mounted on the wiring substrate, the holding structure makes the lower terminal of the pin member to be pressed by the wiring substrate so that the pin member moves upward against the urging force of the first spring, the upper terminal of the pin member moves upward, the floating plate is released from holding the upper terminal of the pin member, and the floating plate become capable of moving vertically under the state of being urged by the second spring.

According to the feature, the lower terminal of the pin member is pressed by the wiring substrate and so the pin member is forcibly moved upward against the urging force of the first springs when the contact pin unit is mounted on the wiring substrate. As a result, the upper terminal of the pin member moves upward and so the floating plate is released from being held by the pin member, then, the floating plate becomes possible to move vertically under the state of being urged upward by the second spring. Thus, the pin member is pressed and the floating plate is released from holding only by mounting the contact pin unit on the wiring substrate, and so any particular operation is unnecessary for releasing the holding, consequently, providing satisfactory workability.

Other feature of the present invention is that the pin member is constituted by threading a male thread member into a female thread member.

Other feature of the present invention is that an upper side head portion, a diameter of which is larger than that of an insertion hole for inserting the pin member of the floating plate, is provided at the upper terminal of the pin member.

Other feature of the present invention is that a lower side head portion, which projects downward from an insertion hole for inserting the pin member of the floating plate, is provided at the lower terminal of the pin member.

Furthermore, other feature of the present invention is that the socket body comprises a cover member rotatably disposed to the socket body, and the socket body is constituted so that the electrical part is pressed and the floating plate is moved downward when the cover member is closed.

DETAILED DESCRIPTION

An preferred embodiment according to the present invention is described hereinafter.

FIGS. 1 to 18C shows an embodiment of the present invention.

Firstly, the constitution of the present embodiment is described. In FIGS. 1 to 18C, the reference symbol 11 shows the IC socket as 'socket for electrical part'. The IC socket 11 is constituted to be mounted on the wiring substrate P. The IC package 12 is used to electrically connect the spherical terminals 12b as 'terminal' of the IC package 12 and the wiring substrate P to perform burn-in-test etc. of the IC package as an 'electrical part'.

Figure 18A:
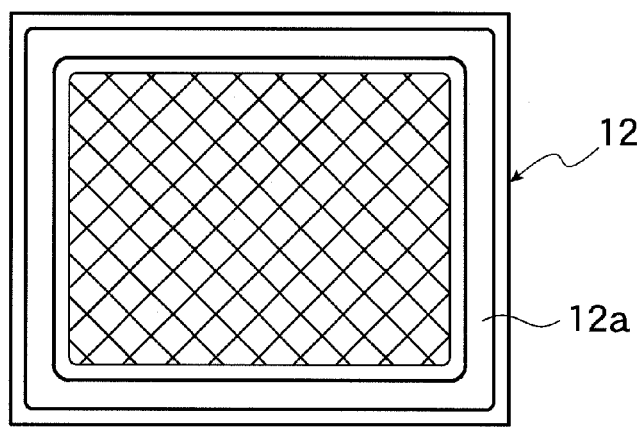
FIG. 18A is a plane view showing the IC package according to the same embodiment.
Figure 18B:
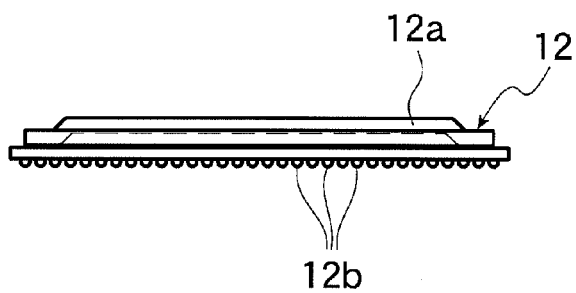
FIG. 18B is an elevation view showing the IC package according to the same embodiment.
Figure 18C:
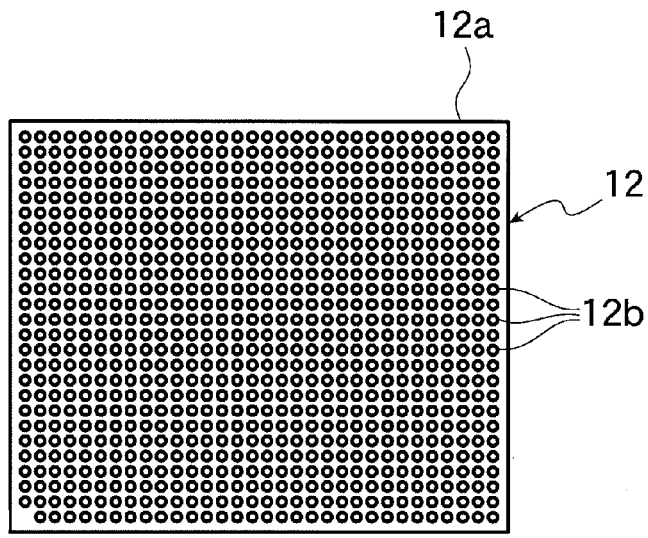
FIG. 18C is a base view showing the IC package according to the same embodiment.

As shown in FIG. 18A to 18C, the IC package 12 comprises the package body 12a, the planar view of which is quadrangle. A matrix of plural spherical terminals 12b as 'terminal' are formed so as to project from the lower surface of the package body 12a.

Figure 1:
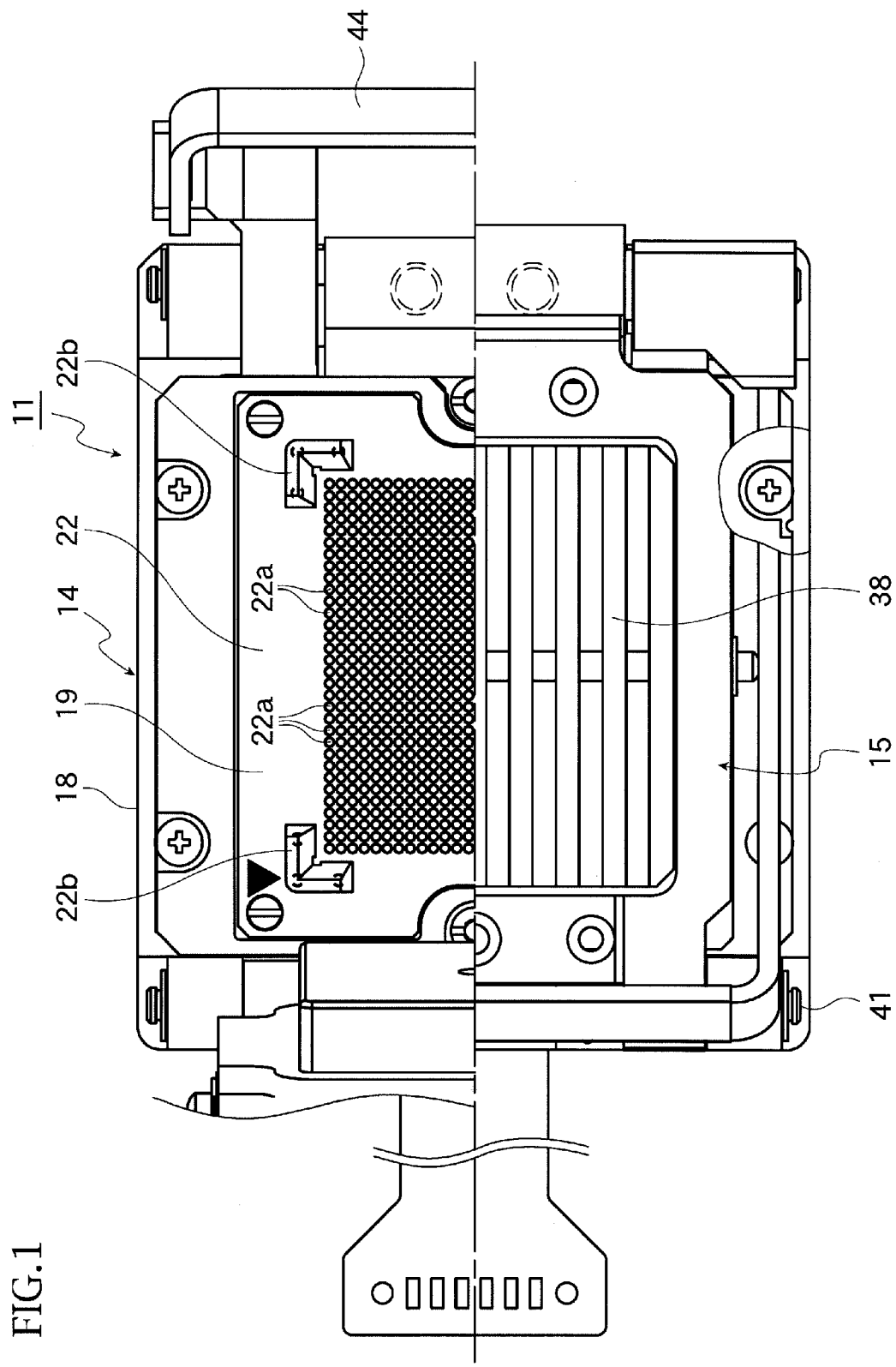
FIG. 1 is a plane view of the IC socket according to the embodiment of the present invention.
Figure 2:
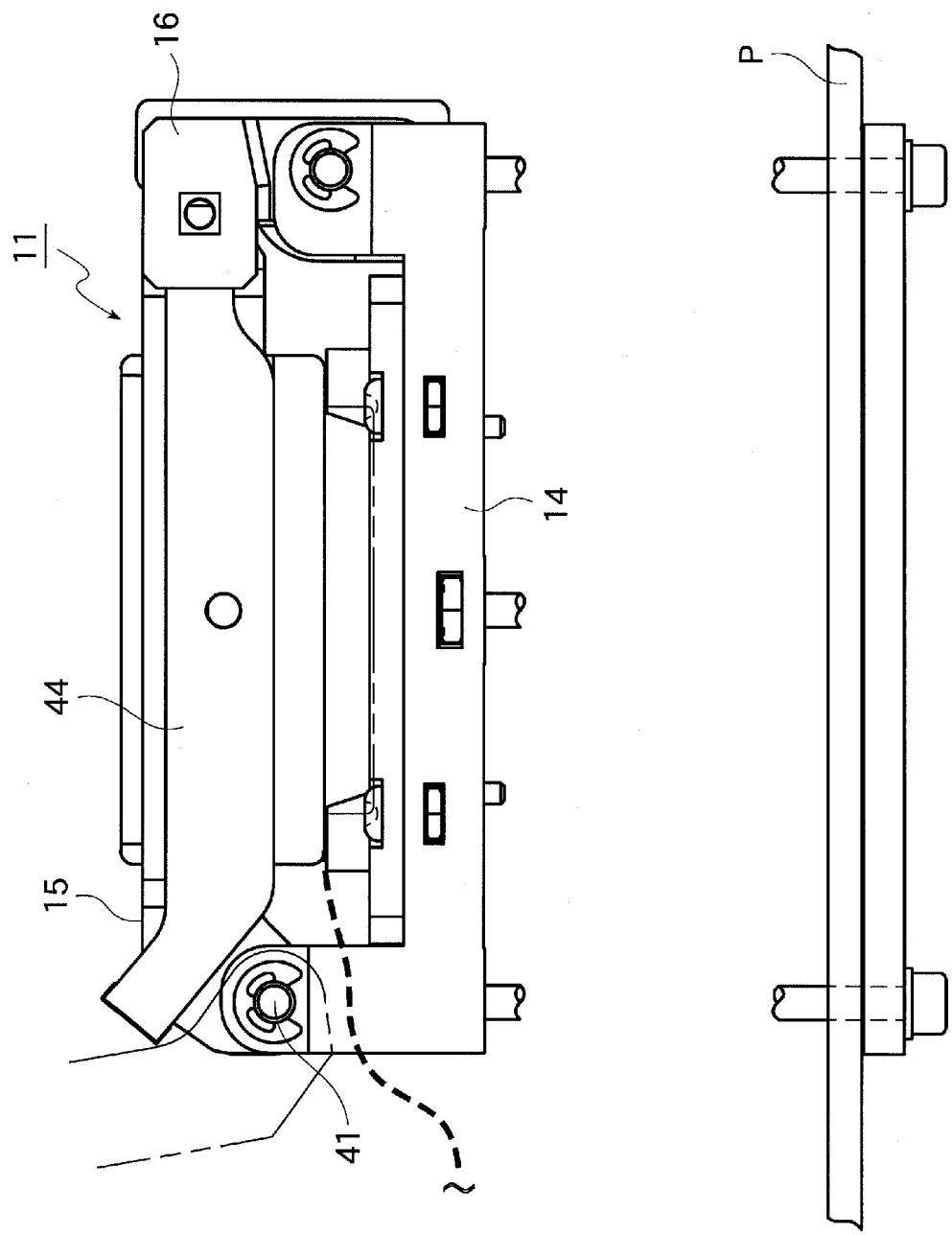
FIG. 2 is an elevation view of the IC socket according to the same embodiment.
Figure 3:
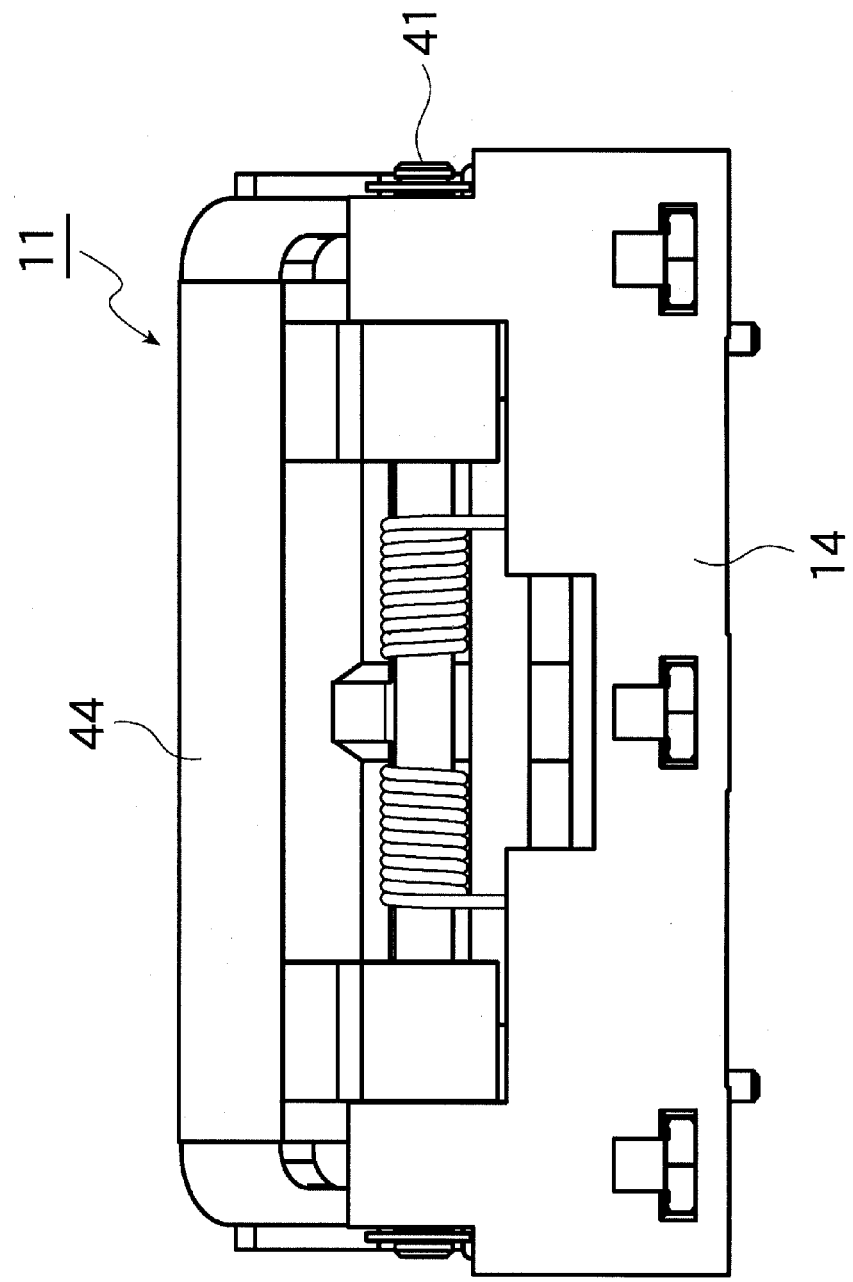
FIG. 3 is a left side view of the IC socket according to the same embodiment.

Incidentally, as shown in FIG. 1, 2 and so on, the IC socket 11 is fixed on the wiring substrate P, and comprises the socket body 14 in which the IC package 12 is accommodated, the cover member 15 which is disposed to the socket body 14 so as to be openable and closable and is used for pressing the IC package 12, and the lock structure 16 to lock the cover member 15 of closing state.

More particularly, the socket body 14 comprises the contact pin unit 19 mounted in the external frame 18 having a shape of quadrangle frame.

Figure 13:
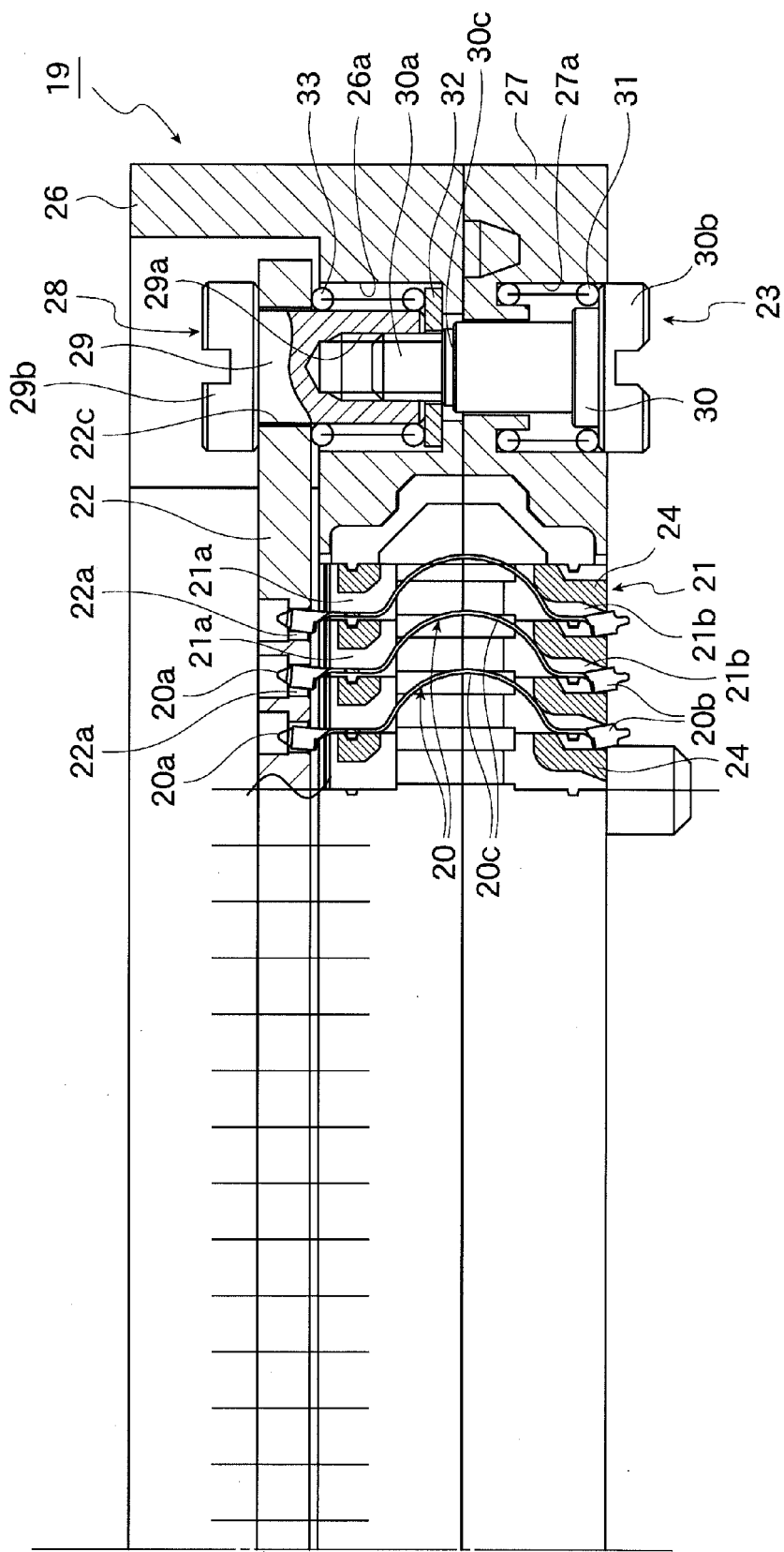
FIG. 13 is an enlarged cross-section view partly showing the holding structure of the contact pin unit when the IC socket of the same embodiment is carried.
Figure 14:
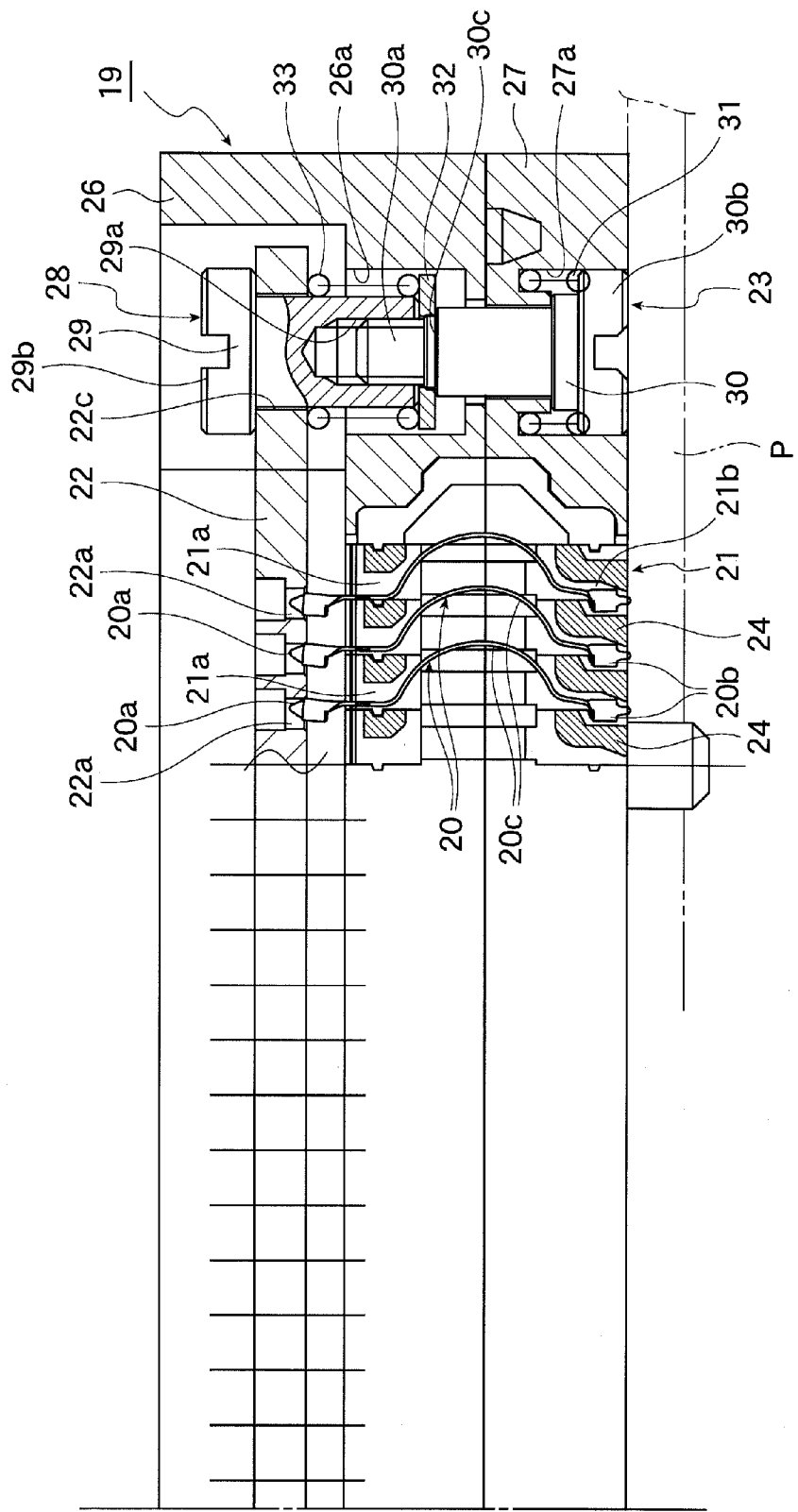
FIG. 14 is an enlarged cross-section view showing a state in which the IC socket according to the same embodiment is mounted on the wiring substrate.
Figure 15:
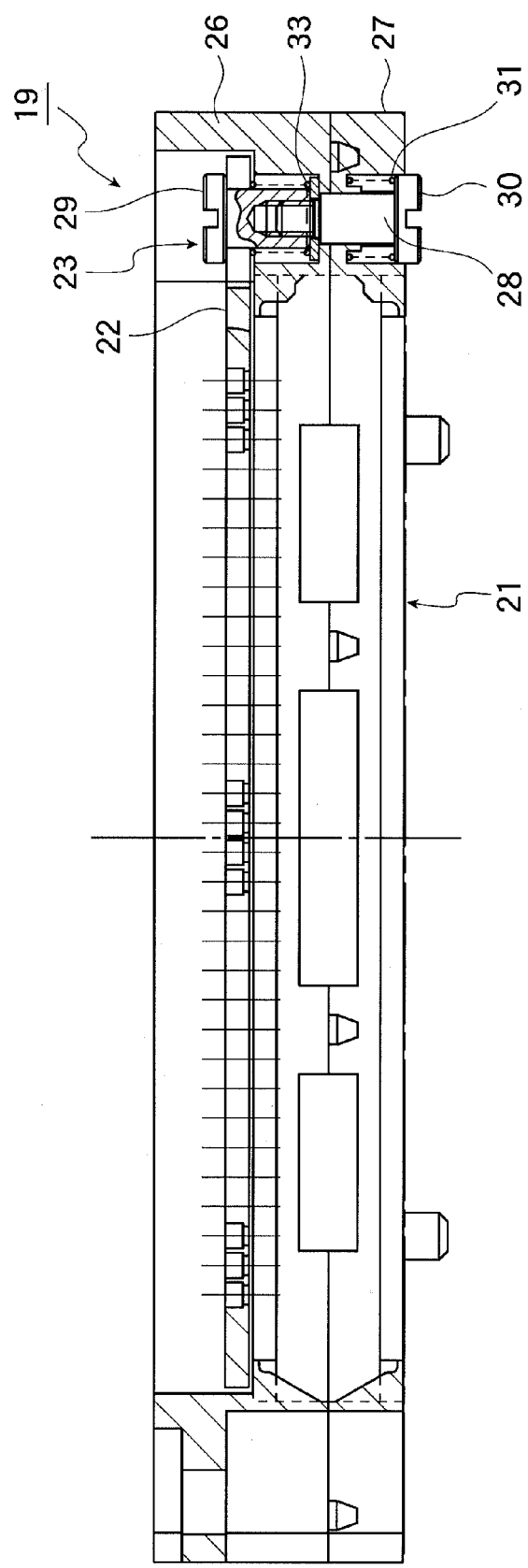
FIG. 15 is a partial cross-section view of the contact pin unit of the IC socket according to the same embodiment when the IC socket is carried.
Figure 16:
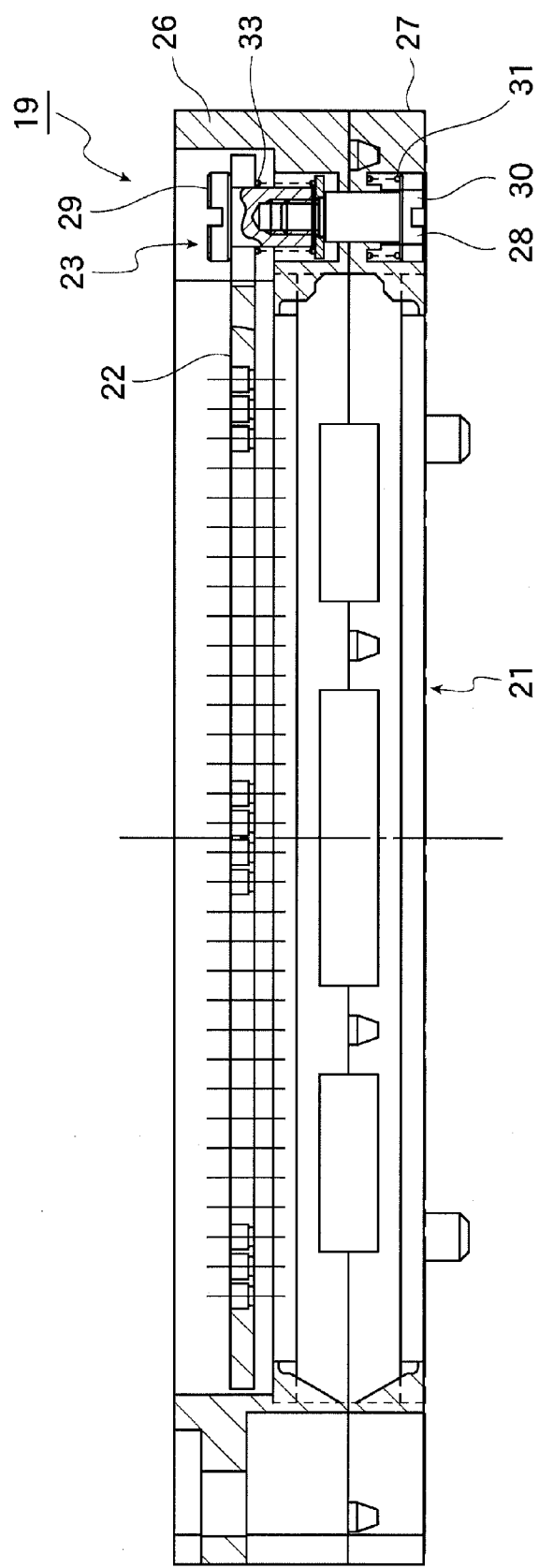
FIG. 16 is a partial cross-section view corresponding to FIG. 15, showing the contact pin unit of the IC socket according to the same embodiment under a state the IC socket is mounted on the wiring substrate.

The contact pin unit 19 comprises the unit body 21 in which plural contact pin 20 is mounted, the floating plate 22 mounted on upper side of the unit body 21 and accommodates the IC package 12, the holding structure 23 which holds the floating plate 22 in a descended state when the IC socket 11 is not yet mounted on the wiring substrate P (shown in FIGS. 13 and 15), and which releases the holding state of floating plate 22 so that the floating plate 22 is urged upward and can vertically move when the IC socket 11 is mounted on the wiring substrate P (shown in FIGS. 14 and 16).

Figure 9:
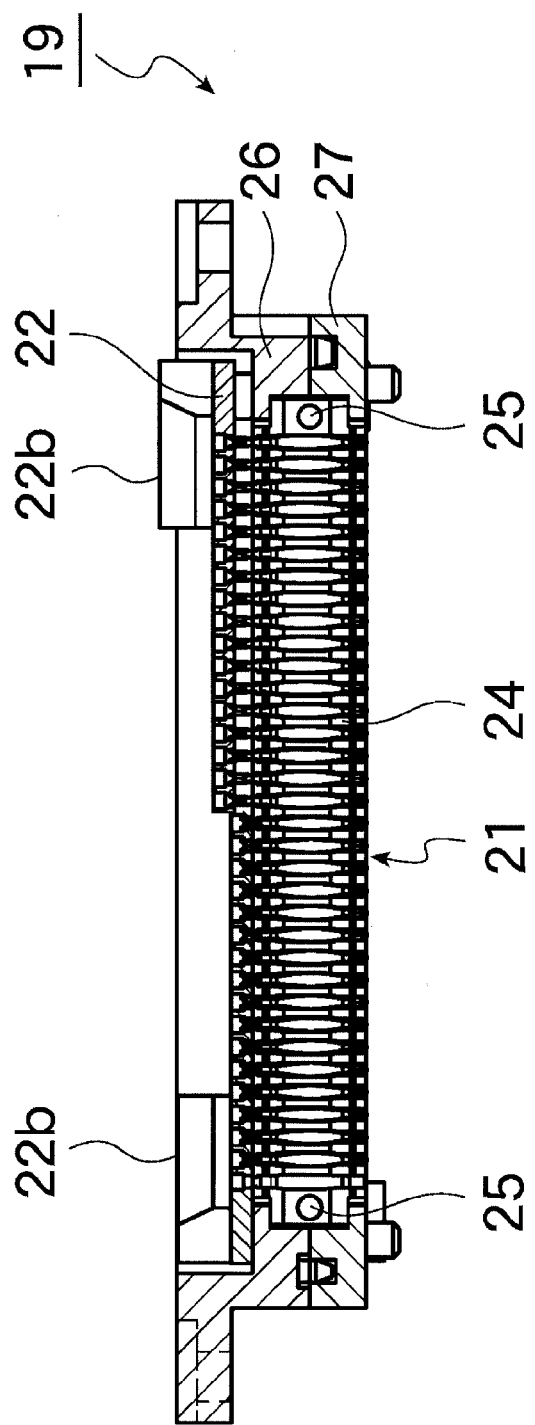
FIG. 9 is a cross-section view according to the same embodiment showing the configuration of FIG. 7 being sectioned along the B-B line.
Figure 10:
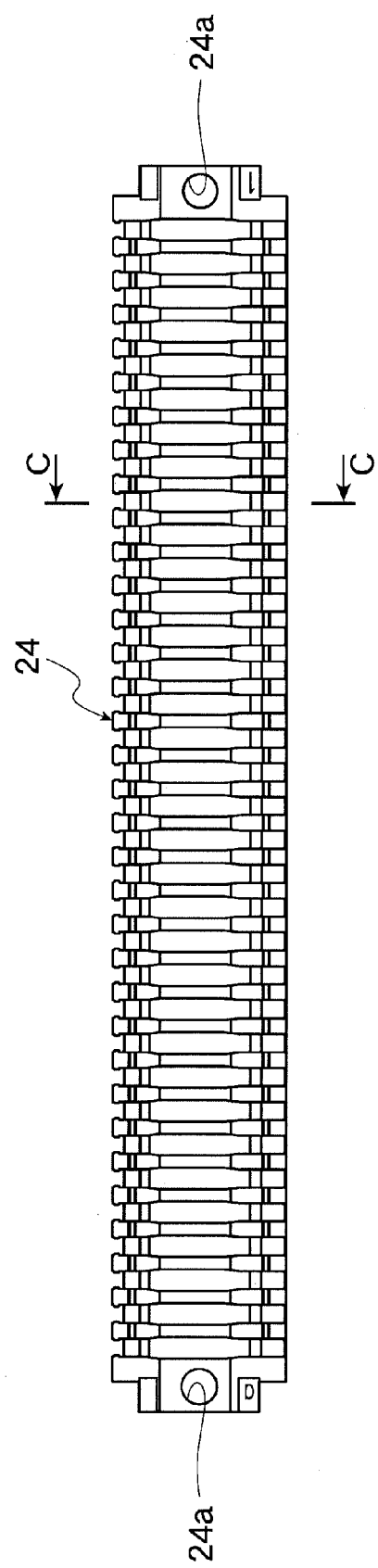
FIG. 10 is an elevation view of the assignment plate of the IC socket according to the same embodiment.
Figure 11:
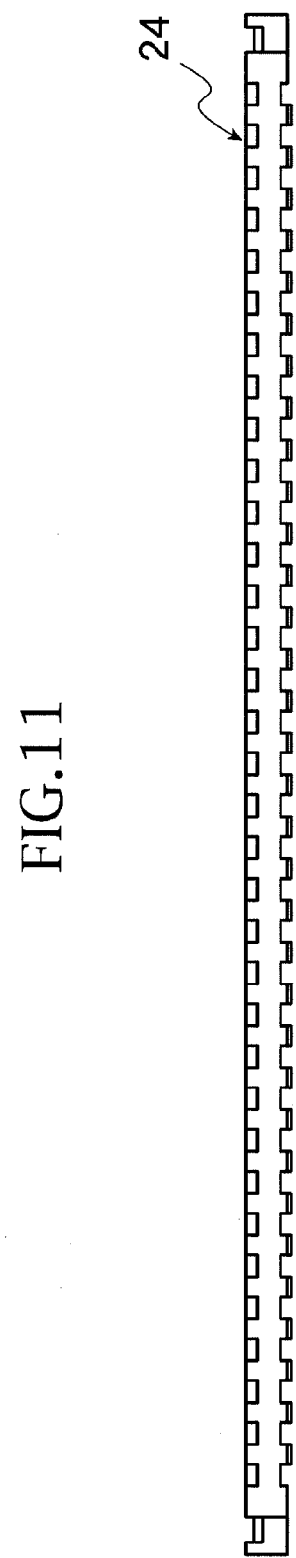
FIG. 11 is plane view of the assignment plate of the IC socket according to the same embodiment.
Figure 12:
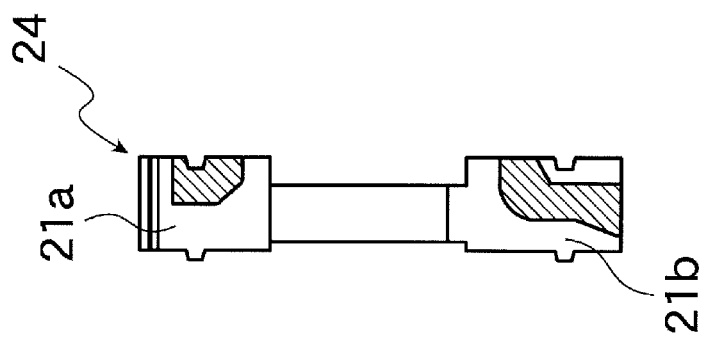
FIG. 12 is a cross-section view according to the same embodiment showing the configuration of FIG. 7 being sectioned along the C-C line.

As shown in FIG. 10 through 12, the unit body 21 comprises the assignment plates 24 which have rectangle plate shapes, and both sides of which have guide holes 24a. As shown in FIG. 9, the guide shafts 25 are inserted into the guide holes 24a. As a result, a lot of assignment plates 24 can be mounted in parallel. These assignment plates 24 are held by being pinched between the upper side plate 26 and the lower side plate 27 vertically (shown in FIGS. 8 and 9). In addition, plural contact pins 20 are placed in the unit body 21 provided with a lot of assignment plates 24 mounted in parallel (shown in FIGS. 13 and 14). As shown in FIGS. 13 and 14, the upper side through holes 21a and the lower side through holes 21b, into which the contact pins 20 are inserted, are formed in the unit body 21.

Moreover, as shown in FIGS. 13 and 14, the floating plate 22 are urged upward by the holding structure 23 detailed below. The floating plate 22 comprises a lot of through holes 22a into which the contact pins 20 are inserted, and, as shown in FIG. 1 and so on, guide portions 22b which guide each angles of corner of the IC package 12.

As shown in FIGS. 13 and 14, each of the contact pins 20 comprises a lower side contact portion 20b for contacting to the electrode of the wiring substrate P, a upper side contact portion 20a for contacting to the spherical terminal 12b of the IC package 12, and the spring portion 20c formed by bending the portion between the both contact portion 20a, 20b.

Figure 7:
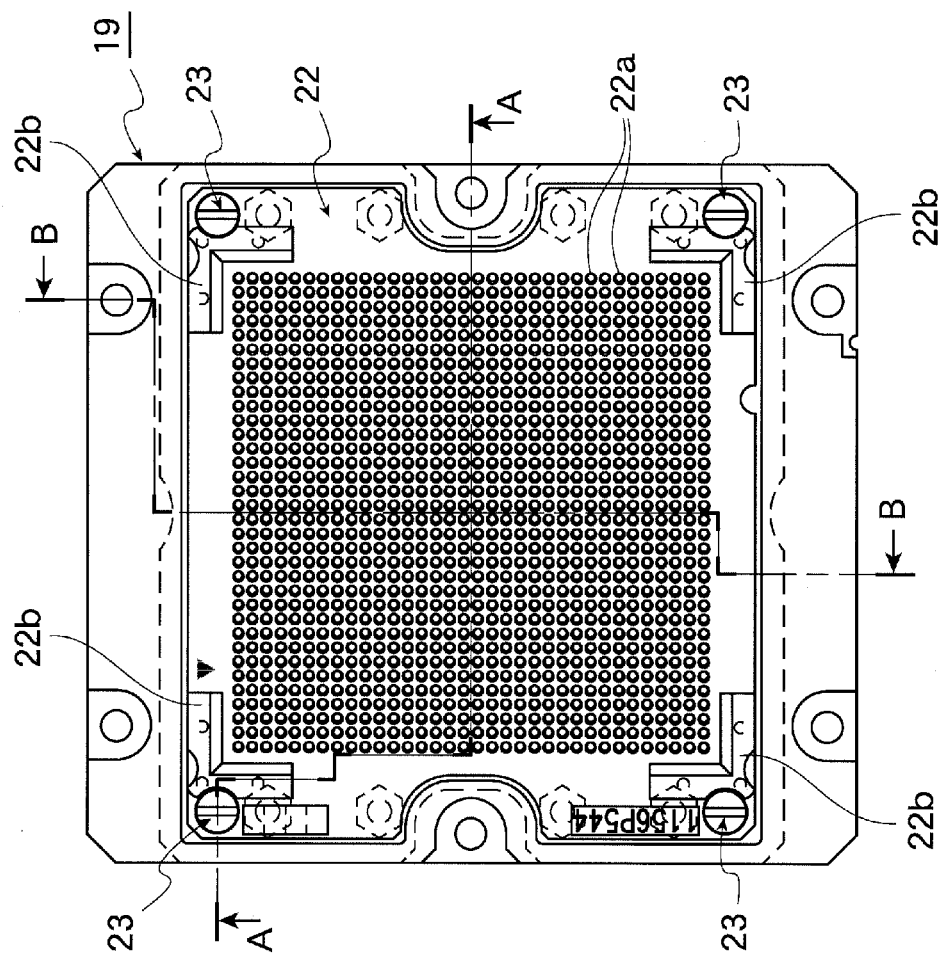
FIG. 7 is a plain view showing the contact pin unit of the IC socket according to the same embodiment.
Figure 8:
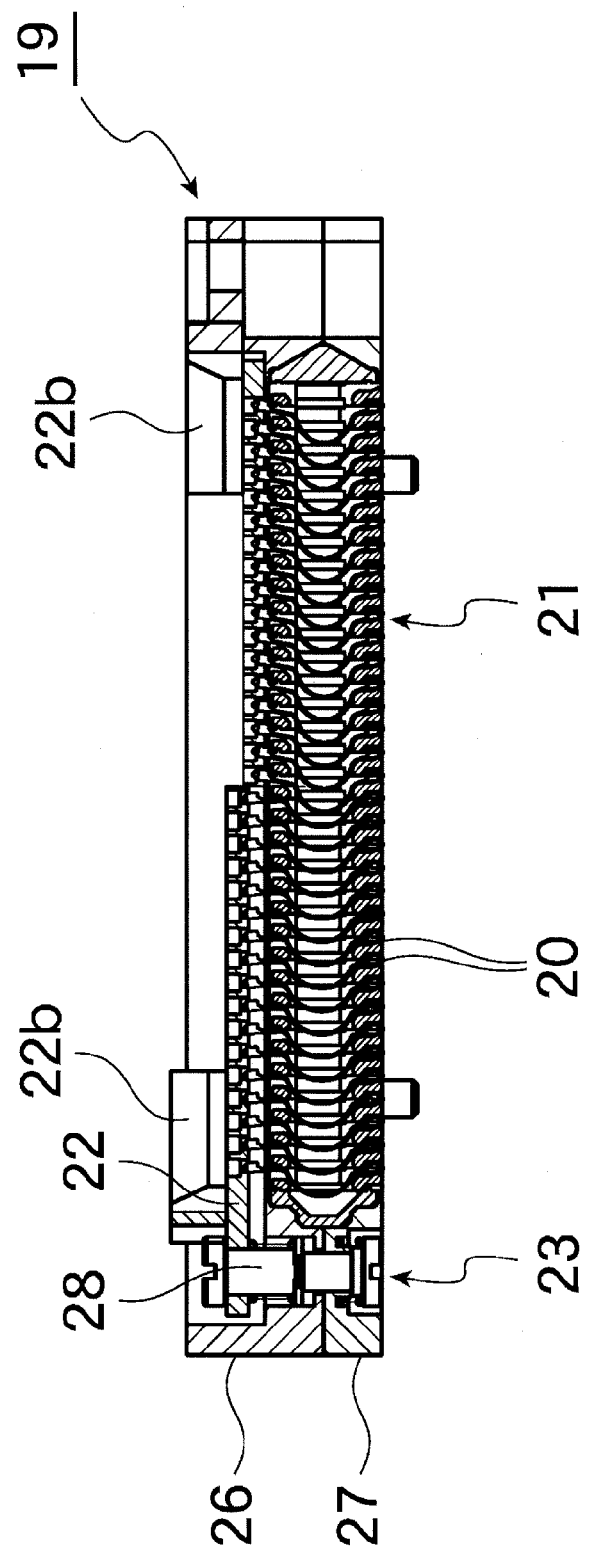
FIG. 8 is a cross-section view according to the same embodiment showing the configuration of FIG. 7 being sectioned along the A-A line.

The holding structures 23 are placed at the four corners as shown in FIG. 7, and comprises the pin members 28 which is placed so as to be capable of moving vertically by being inserted vertically into the insertion holes 26a and 27a of the upper side plates 26 and lower side plate 27 of the unit body 21, and into the insertion hole 22c of the floating plate 22.

As shown in FIGS. 13 and 14, pin members 28 are constructed by threading the male thread members 30 placed at the lower side into the female thread members 29 placed at the upper side.

The female thread members 29 comprise the female thread portions 29a and the upper side head portions 29b provided at the upper terminals. The upper side head portions 29b project upward from the upper side of the floating plate 22, and the diameters of which are larger than that of the insertion holes 22c of the floating plates 22.

The male thread members 30 comprise the male thread portions 30a for being threaded into the female thread portions 29a and the lower side head portions 30b at the lower terminals. The lower side head portions 30b go out downward from the insertion holes 27a of the lower side plates 27 and go into it.

The first springs 31, which urges the pin members 28 downward, are disposed between the lower side head portions 30b and the lower side plate 27. In addition, the second springs 33, which urges the floating plate 22 upward, are disposed between the intermediate plates 32 and the floating plate 22. The intermediate plates 32 are placed on the step portions 30c mounted at the intermediate portions of vertical direction. The pin members 28 are inserted into the intermediate plates 32. As described above, the intermediate plates 32 are mounted on the step portion 30c for receiving the second springs 33.

As shown in FIG. 13, the contact pin unit 19 is constituted so as to move the pin members 28 downward by the urging forces of the first springs 31, make the lower terminal portions (i.e. the lower side head portions 30b) of the pin members 28 to project downward from the unit body 21 and make the intermediate plates 32 to contact with the upper side plate 26 by the urging force of the second springs 33 and so the pin members 28 holds the floating plate 22 under the state the floating plate 22 is moved down when the IC socket 11 is not yet mounted on the wiring substrate P.

Furthermore, as shown in FIG. 14, the contact pin unit 19 is constituted so that the lower terminal portions of the pin members 28 (i.e. the lower side head portions 30b) are pressed by the wiring substrate P and so the pin members 28 move upward against the urging force of the first springs 31, when the IC socket 11 is mounted on the wiring substrate P. As a result, the intermediate plates 32 move upward, so the floating plate 22 is released from being held by the pin members 28, then, the floating plate 22 becomes vertically movable while being urged by the second springs 33.

Figure 4:
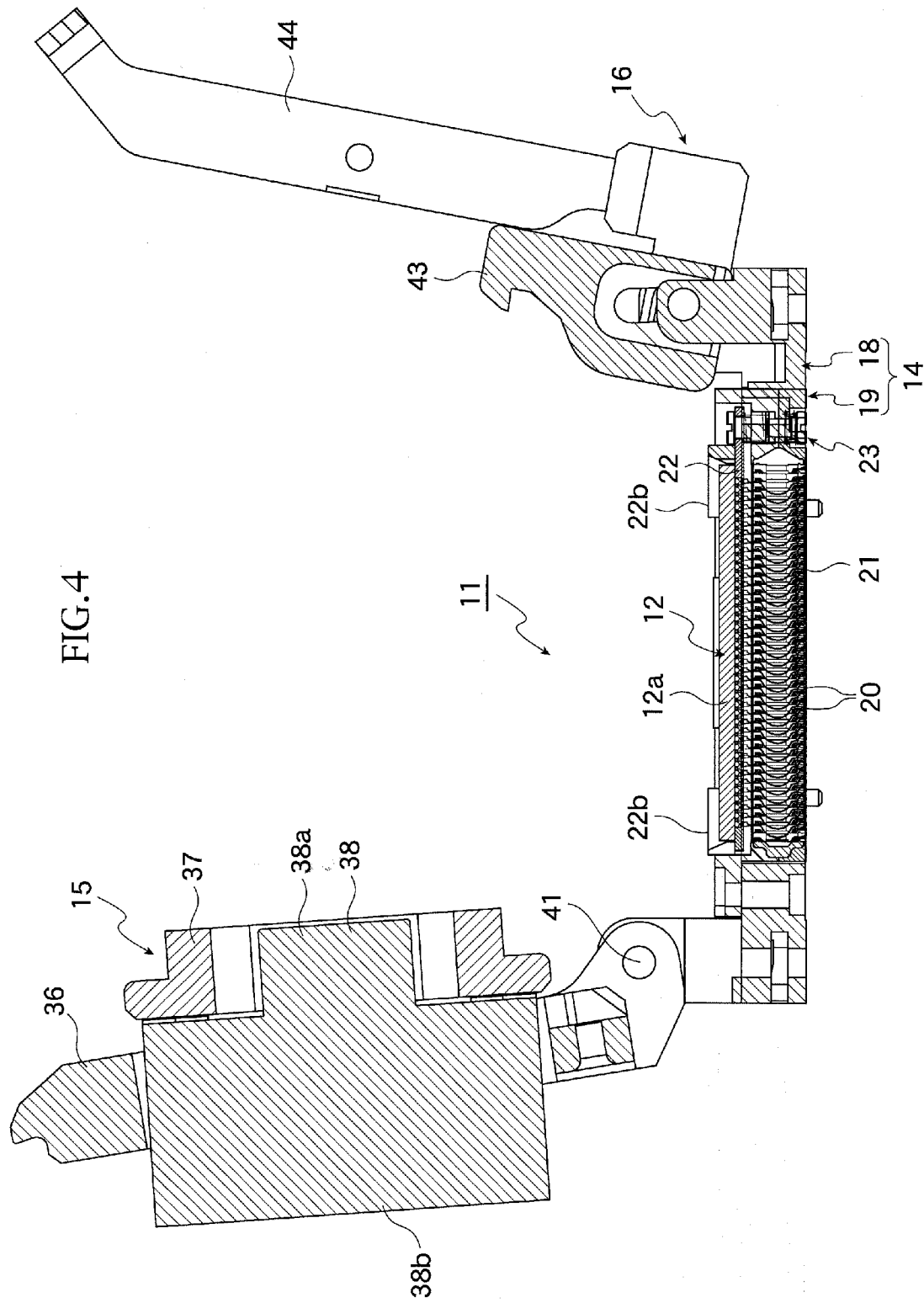
FIG. 4 is a cross-section view of the IC socket according to the same embodiment, showing an opening state of the cover member of the IC socket.

Moreover, as shown in FIG. 4 and so on, the cover member 15 comprises the quadrilateral frame member 36 which is rotatably disposed to the socket body 14, the press member 37 which is held inside the frame member 36 and presses the IC package 12 when the cover member 15 is closed, and the heatsink 38 provided on the press member 37.

Figure 5:
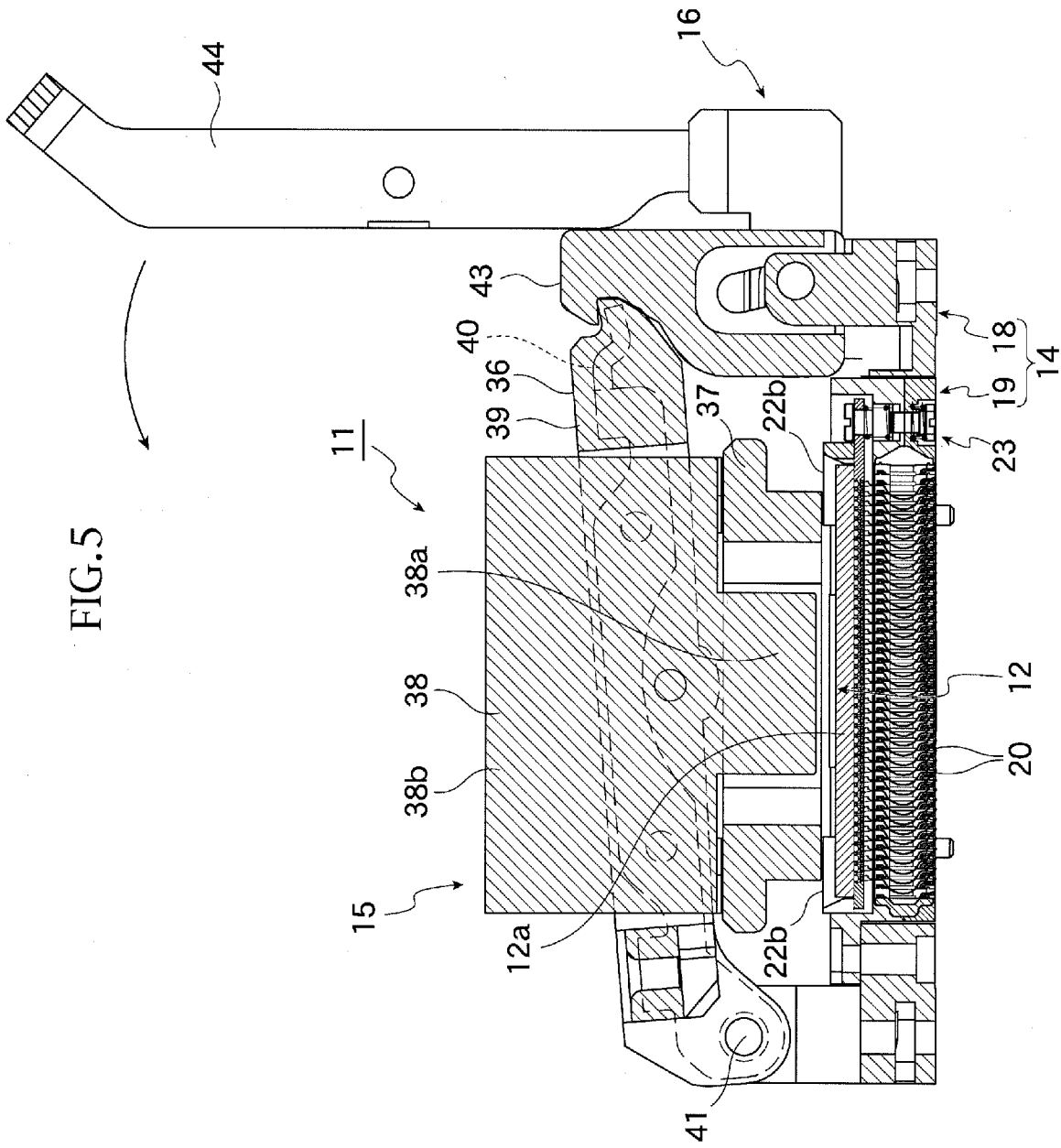
FIG. 5 is a cross-section view corresponding to FIG. 4, showing the IC socket according to the same embodiment under a state that the cover member is partly closed.
Figure 6:
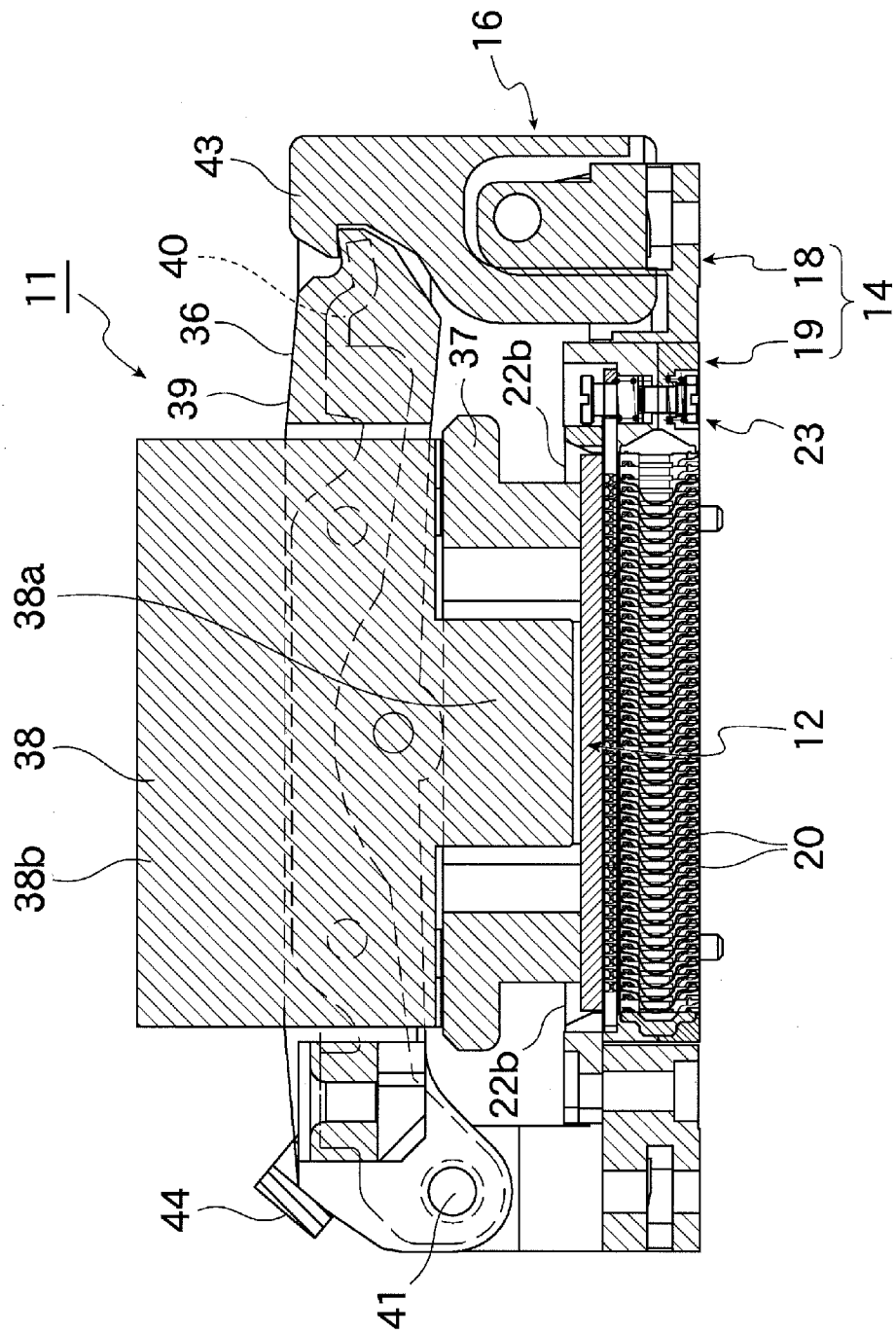
FIG. 6 is a cross-section view corresponding to FIG. 4, showing the IC socket according to the same embodiment under a state the cover member is completely closed.

As shown in FIGS. 5 and 6, the frame member 36 is formed by the synthetic resin member 39 of quadrilateral frame shape and the metal plate 40 of quadrilateral frame shape by using insert molding. The frame member 36 is installed in the socket body 14 so as to be rotatable via the rotational shaft 41.

In addition, as shown in FIGS. 5 and 6, the lock structure 16 comprises the latch member 43 which is latched to the top portion of the frame member 36 and the lock lever 44 which makes the latch member 43 to move downward via the cam structure not shown in figures. If the lock lever 44 under the state shown in FIG. 5 is rotated along the arrowed line of FIG. 5 and is lied down to be horizontal, the latch member 43 moves downward and so the press member 37 presses the IC package 12 as shown in FIG. 6, then, the IC package 12 is locked under the state of being pressed.

Hereinafter, the method of use of the IC socket 11 is described.

As shown in FIGS. 13 and 15, when the contact pin unit 19 is not yet mounted on the wiring substrate P (for example, when IC socket 11 is carried), the pin members 28 are moved downward by the urging force of the first springs 31, and so the lower terminals of the pin members 28 (i.e. the lower side head portions 30b) project downward from the unit body 21.

And the upper terminal portions of the pin members 28 (i.e. the upper side head portions 29b), which project upward from the floating plate 22, hold the floating plate 22 under the state that the floating plate 22 is moved down.

As described above, when the IC socket 11 is carried, the upper contact portions 20a are surely inserted into the though holes 22a of the floating plate 22 even if the sizes of the contact pins 20 are too short, because the floating plate 22 is moved downward and is held under the state of contacting to the unit body 21.

Therefore, there is no risk that the upper side contact portions 20a of the contact pins 20 come off from the through holes 22a of the floating plate 22 when the IC socket 11 is carried, and so there is no risk that some failure occur even when the IC socket 11 is used (i.e. when the floating plate 22 moves vertically).

On the other hand, when the contact pin unit 19 is mounted on the wiring substrate P, as shown in FIGS. 14 and 16, the lower terminal portions of the pin members (i.e. the lower side head portions 30b) are pressed by the wiring substrate P and so the pin members 28 forcibly move upward against the urging force of the first springs 31.

Then, the upper terminal portions of the pin members (i.e. the upper side head portions 29b) move upward and so the floating plate 22 is released from being held by the pin members 28. As a result, The floating plate 22 becomes vertically movable under the state that the floating plate 22 is urged upward by the second springs 33.

As described above, the pin members 28 are pressed and the floating plate 22 is automatically released from being held by the pin members 28 only by mounting the contact pin unit 19 on the wiring substrate P. Therefore, particular operations for releasing the floating plate 22 being hold are unnecessary, and so the workability is satisfactory.

Additionally, when the such mounted IC socket 11 is used, firstly, the IC package 12 is accommodated on the floating plate 22 under the state the cover member 15 of the IC socket 11 is opened, as shown in FIG. 4. When the IC package 12 is accommodated, the IC package 12 is guided by the guide portion 22b of the floating plate 22.

Then, as shown in FIG. 5, the cover member 15 is gradually closed, and the top portion of the frame member 36 is latched by the latch member 43. Next, the lock lever 44 is rotated along the arrowed line of FIG. 5 and is lied down as shown in FIG. 6, the latch member 43 moves downward and so the press member 37 presses the IC package 12, then, the IC package 12 is locked under the state of being pressed.

Figure 17:
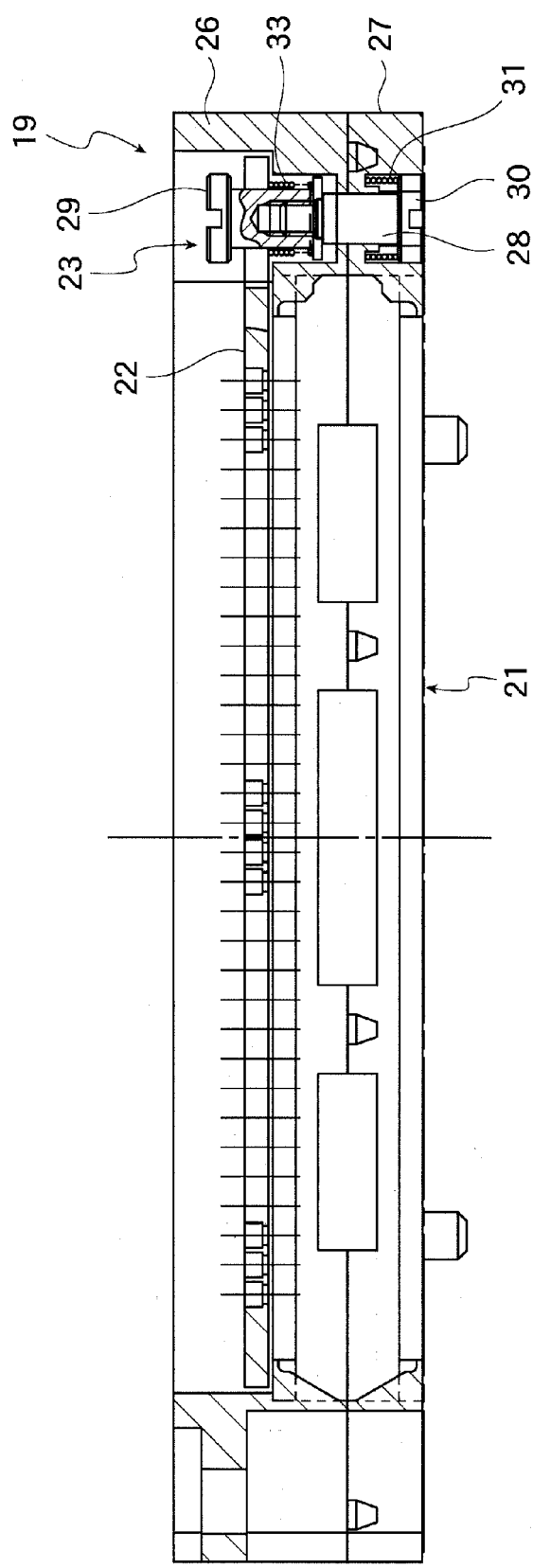
FIG. 17 is a partial cross-section view corresponding to FIG. 15, showing the contact pin unit of the IC socket according to the same embodiment under a state the floating plate of the contact pin unit of the IC socket is pushed down.

As a result, the IC package 12 is pressed downward by the press member 20 and so the floating plate 22 is pressed downward against the urging force of the second springs 33 (shown in FIGS. 6 and 17).

Under such state, the spring portions 20c of the contact pins 20 are elastically deformed, and so the upper side contact portions 20a of the contact pins 20 are contacted to the spherical terminals 12b at a predetermined contact pressure, simultaneously, the lower side contact portions 20b are contacted to the electrode portions of the wiring substrate P at another predetermined contact pressure. In addition, the center projecting portion 38a of the heatsink 38 contacts with the IC package 12, then, the radiation portion 38b executes heat radiation.

Under such state, the electric current is supplied to the IC package 12 and the burn-in test of the IC package 12 is performed.

In the above described embodiment, the present invention is applied to the IC socket 11 as 'socket for electrical part', however, it is clear that the present invention can be applied to other kinds of apparatuses.

Moreover, the 'holding structure' of the present invention is not limited to the above mentioned structure, and other structures can be employed if it holds the floating plate 22 in a descended state when IC socket 11 is not yet mounted on the wiring substrate P and it releases the holding state of the floating plate 22 so that the floating plate 22 is urged upward and can vertically move when the IC socket 11 is mounted on the wiring substrate P.

For example, the present invention can be provided with a lock lever which holds the floating plate 22 by latching the upper surface of the floating plate 22 using the one terminal side of the lock lever when the floating plate 22 is moved downward, and which releases the holding of the floating plate 22 by making the other terminal side of the lock lever to contact with the wiring substrate P, making the lock lever to rotate and to release the latching of one terminal side when the IC socket 11 is mounted on the wiring substrate P.

Furthermore, in the above described embodiment, the external frame 18 and the contact pin unit 19 of the socket body 14 are formed individually, however, these can be formed integrally if the floating plate is made to be capable of moving vertically.

What is claimed is:

1. A socket which is mountable on a wiring substrate and accommodates an electrical part having terminals, wherein
the socket comprises a socket body which is mounted on the wiring substrate and accommodates the electrical part,
the socket body comprises a contact pin unit holding plural contact pins to electrically connect the terminals of the electrical part with the wiring substrate,
the contact pin unit comprises
a unit body in which the plural contact pins are mounted,
a floating plate which is mounted on an upper side of the unit body to accommodate the electrical part and comprises through holes into which upper side contact portions of contact pins are inserted, and
a holding structure which
holds the floating plate in a state in which the floating plate descends near to the upper side of the unit body when the socket is not yet mounted on the wiring substrate, and releases the holding of the floating plate and makes the floating plate move upward by an urging force and to be vertically movable against the urging force when the socket is mounted on the wiring substrate,
wherein the holding structure comprises
a pin member which is inserted into a first insertion hole of the unit body and a second insertion hole of the floating plate vertically so as to be capable of moving vertical,
a first spring which urges the in member downward, and
a second spring which urges the floating plate upward.

2. The socket according to claim 1, wherein
the pin member comprises a step portion, and
the holding structure further comprises
an intermediate plate comprising a third insertion hole into which the pin member is inserted, the intermediate plate being located on the step portion to receive the second spring,
when the socket is not yet mounted on the wiring substrate, the holding structure makes the pin member move downward by the urging force of the first spring so that the lower terminal of the pin member projects downward from the unit body, and makes the upper terminal of the pin member project upward from the floating plate, to hold the floating plate in a descended state, and
when the socket is mounted on the wiring substrate, the holding structure makes the lower terminal of the pin member to be pressed by the wiring substrate so that the pin member moves upward against the urging force of the first spring, the upper terminal of the pin member moves upward, the floating plate is released from holding the upper terminal of the pin member, and the floating plate becomes capable of moving vertically under a state of being urged by the second spring.

3. The socket according to claim 2, wherein the pin member is constituted by a male thread member threaded into a female thread member.

4. The socket according to claim 2, wherein an upper side head portion is provided at the upper terminal of the pin member, a diameter of the upper side head portion being larger than that of an insertion hole for inserting the pin member of the floating plate.

5. The socket according to claim 2, wherein a lower side head portion is provided at the lower terminal of the pin member, the lower side head portion projecting downward from an insertion hole for inserting the pin member of the floating plate.

6. The socket according to claim 1, wherein,
the socket body comprises a cover member rotatably disposed to the socket body, and
the socket body is constituted so that the electrical part is pressed and the floating plate is moved downward when the cover member is closed.

\* \* \* \* \*

UNITED STATES PATENT AND TRADEMARK OFFICE
CERTIFICATE OF CORRECTION

| | | |
|---|---|---|
| PATENT NO. | : 8,562,367 B2 | Page 1 of 1 |
| APPLICATION NO. | : 13/270476 | |
| DATED | : October 22, 2013 | |
| INVENTOR(S) | : Yuji Yokoyama | |

It is certified that error appears in the above-identified patent and that said Letters Patent is hereby corrected as shown below:

In the Claims
In Column 8, Line 9, In Claim 1, delete "in" and insert -- pin --, therefor.

Signed and Sealed this
Twenty-eighth Day of January, 2014

Michelle K. Lee
*Deputy Director of the United States Patent and Trademark Office*